US009110570B1

(12) United States Patent
Aldrich

(10) Patent No.: US 9,110,570 B1
(45) Date of Patent: Aug. 18, 2015

(54) REVERSED LINKS FROM GRAPHICAL DIAGRAM REPRESENTATION

(75) Inventor: William J. Aldrich, Natick, MA (US)

(73) Assignee: THE MATHWORKS, INC., Natick, MA (US)

( * ) Notice: Subject to any disclaimer, the term of this patent is extended or adjusted under 35 U.S.C. 154(b) by 84 days.

(21) Appl. No.: 13/268,958

(22) Filed: Oct. 7, 2011

Related U.S. Application Data

(63) Continuation of application No. 10/637,433, filed on Aug. 7, 2003, now Pat. No. 8,046,708.

(51) Int. Cl.
G06F 3/00 (2006.01)
G06F 3/0484 (2013.01)

(52) U.S. Cl.
CPC .................. G06F 3/0484 (2013.01)

(58) Field of Classification Search
CPC ................ G06F 3/048; G06F 3/0483–3/0484
USPC .................. 715/771, 205, 211, 705, 760, 763
See application file for complete search history.

(56) References Cited

U.S. PATENT DOCUMENTS

| 5,220,512 | A | * | 6/1993 | Watkins et al. | 716/102 |
| 5,341,466 | A | * | 8/1994 | Perlin et al. | 345/668 |
| 5,638,523 | A | * | 6/1997 | Mullet et al. | 715/855 |
| 5,694,594 | A | * | 12/1997 | Chang | 1/1 |
| 5,708,825 | A | * | 1/1998 | Sotomayor | 715/205 |
| 5,793,369 | A | * | 8/1998 | Atkins et al. | 715/787 |
| 5,793,966 | A | * | 8/1998 | Amstein et al. | 709/203 |
| 5,805,171 | A | * | 9/1998 | St. Clair et al. | 345/619 |
| 5,933,841 | A | | 8/1999 | Schumacher et al. | |
| 5,963,205 | A | | 10/1999 | Sotomayor | |
| 5,978,818 | A | * | 11/1999 | Lin | 715/209 |
| 6,035,330 | A | * | 3/2000 | Astiz et al. | 709/218 |
| 6,051,029 | A | * | 4/2000 | Paterson et al. | 703/22 |
| 6,055,541 | A | | 4/2000 | Solecki et al. | |
| 6,069,629 | A | * | 5/2000 | Paterson et al. | 715/808 |
| 6,078,739 | A | | 6/2000 | Paterson et al. | |
| 6,111,561 | A | * | 8/2000 | Brandau et al. | 715/781 |
| 6,125,375 | A | * | 9/2000 | Atkins et al. | 715/207 |
| 6,268,851 | B1 | * | 7/2001 | Bricklin et al. | 715/744 |
| 6,301,579 | B1 | | 10/2001 | Becker | |
| 6,339,838 | B1 | | 1/2002 | Weinman, Jr. | |
| 6,442,574 | B1 | | 8/2002 | Schumacher et al. | |
| 6,457,026 | B1 | * | 9/2002 | Graham et al. | 715/234 |
| 6,490,619 | B1 | * | 12/2002 | Byrne et al. | 709/223 |
| 6,493,733 | B1 | * | 12/2002 | Pollack et al. | 715/207 |
| 6,496,208 | B1 | * | 12/2002 | Bernhardt et al. | 715/853 |
| 6,539,347 | B1 | | 3/2003 | Paterson et al. | |
| 6,574,644 | B2 | * | 6/2003 | Hsu et al. | 715/205 |
| 6,585,776 | B1 | * | 7/2003 | Bates et al. | 715/206 |
| 6,606,731 | B1 | * | 8/2003 | Baum et al. | 716/103 |

(Continued)

OTHER PUBLICATIONS

MathWorks et. al. "StateFlow 4.0.4" Jun. 17, 2001.*

(Continued)

Primary Examiner — Steven B Theriault
(74) Attorney, Agent, or Firm — Nelson Mullins Riley & Scarborough LLP

(57) ABSTRACT

A method includes performing an analysis or synthesis operation on a graphical model representation, producing a report from the analysis or synthesis operation and generating associations representing elements of the graphical model representation with corresponding elements in the report and using these associations as a way to reposition viewer based on actions to the graphical model representation.

19 Claims, 4 Drawing Sheets

(56) References Cited

U.S. PATENT DOCUMENTS

| | | | |
|---|---|---|---|
| 6,643,634 B2 | 11/2003 | Koleszar et al. | |
| 6,763,497 B1 | 7/2004 | Softky | |
| 6,769,096 B1* | 7/2004 | Kuppusamy et al. | 715/234 |
| 6,781,069 B2* | 8/2004 | Silverstein et al. | 178/18.01 |
| 6,801,916 B2* | 10/2004 | Roberge et al. | 1/1 |
| 6,940,491 B2* | 9/2005 | Incertis Carro | 345/173 |
| 6,957,191 B1 | 10/2005 | Belcsak et al. | |
| 6,990,629 B1 | 1/2006 | Heaney et al. | |
| 7,015,911 B2 | 3/2006 | Shaughnessy et al. | |
| 7,055,097 B1* | 5/2006 | Netsch | 715/207 |
| 7,069,261 B2* | 6/2006 | Ahl et al. | 1/1 |
| 7,139,686 B1* | 11/2006 | Critz et al. | 703/2 |
| 7,228,492 B1* | 6/2007 | Graham | 715/234 |
| 7,231,333 B2 | 6/2007 | Russell, II et al. | |
| 7,234,138 B2 | 6/2007 | Crevatin | |
| 7,310,784 B1* | 12/2007 | Gottlieb et al. | 715/853 |
| 7,949,937 B2* | 5/2011 | Wu | 715/209 |
| 8,031,206 B2* | 10/2011 | Shoemaker | 345/619 |
| 8,037,527 B2* | 10/2011 | Milener et al. | 726/22 |
| 8,055,994 B1* | 11/2011 | Jones et al. | 715/208 |
| 8,103,367 B2* | 1/2012 | Schleiss et al. | 700/83 |
| 2002/0111932 A1* | 8/2002 | Roberge et al. | 707/1 |
| 2003/0018953 A1* | 1/2003 | Aberg | 717/105 |
| 2003/0071814 A1 | 4/2003 | Jou et al. | |
| 2003/0098862 A1* | 5/2003 | Hunt et al. | 345/418 |
| 2003/0187823 A1* | 10/2003 | Ahl et al. | 707/1 |
| 2004/0114258 A1* | 6/2004 | Harris et al. | 359/841 |
| 2004/0205633 A1* | 10/2004 | Martinez et al. | 715/526 |
| 2004/0243552 A1* | 12/2004 | Titemore et al. | 707/3 |
| 2004/0243614 A1* | 12/2004 | Boone et al. | 707/102 |
| 2005/0010865 A1* | 1/2005 | Kuppusamy et al. | 715/512 |
| 2005/0033773 A1* | 2/2005 | Roberge et al. | 707/104.1 |
| 2005/0066276 A1* | 3/2005 | Moore et al. | 715/700 |
| 2005/0071136 A1* | 3/2005 | Vredenburgh et al. | 703/1 |
| 2005/0203819 A1* | 9/2005 | Rogers et al. | 705/35 |
| 2005/0262047 A1* | 11/2005 | Wu et al. | 707/2 |
| 2007/0061699 A1* | 3/2007 | Battagin et al. | 715/503 |
| 2007/0130517 A1* | 6/2007 | Wu | 715/530 |

OTHER PUBLICATIONS

MathWorks et. al. "Matlab and Simulink Report Generators 1.2" Aug. 2001.*

The MathWorks, "Matlab & Simulink Report Generators 1.2," retrieved online at http://web.archive.org/web/20010630075329/www.mathworks.com/access/helpdesk/help/toolbox/rptgen/rptgen.shtml, 59 pages, (2001).

* cited by examiner

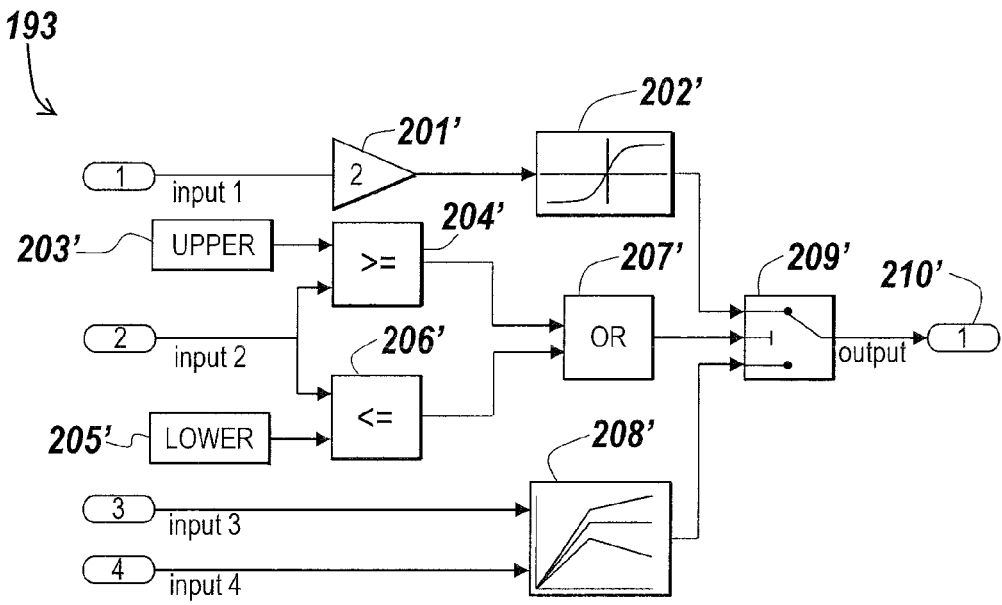

```
192

Block:
  209     /* Switch: '<Root>/Switch' incorporates:
  207      *  Logic: '<Root>/Logical Operator'
  204      *  RelationalOperator: '<Root>/Relational Operator1'
  203      *  Constant: '<Root>/Constant1'
input2     *  Inport: '<Root>/In2'
  206      *  RelationalOperator: '<Root>/Relational Operator'
  205      *  Constant: '<Root>/Constant1'
  202      *  Lookup: '<Root>/Look-Up Table'
  201      *  Gain: '<Root>/Gain'
input1     *  Inport: '<Root>/In1'
  208      *  Lookup2D: '<S1>/Look-Up Table (2-D)'
input3     *  Inport: '<Root>/In3'
input4     *  Inport: '<Root>/In4'
           *
           *  Regarding '<Root>/Gain':
  201      *  Gain value: 2.0
           */
```

*Fig. 4*

REVERSED LINKS FROM GRAPHICAL DIAGRAM REPRESENTATION

RELATED APPLICATION

This application claims benefit of U.S. application Ser. No. 10/637,433 filed Aug. 7, 2003, title: REVERSED LINKS FROM GRAPHICAL DIAGRAM REPRESENTATION, the contents of which are incorporated herein by reference in their entirety.

TECHNICAL FIELD

This invention relates to reverse links from graphical diagram representation.

BACKGROUND

Data representation and modeling are an integral part of working with dynamic real-world systems such as electrical circuits, shock absorbers, braking systems, and many other electrical, mechanical and thermodynamic systems. These systems can be modeled, simulated, analyzed and synthesized on a computer system using graphical environments such as graphical model representations, state diagrams, truth tables and unified modeling language (UML) diagrams. For example, a graphical model representation visually depicts mathematical relationships among a system's inputs, states, parameters, and outputs, typically through the use of a graphical user interface (GUI). Graphical model representation also visually depicts time-dependent mathematical relationships among a system's inputs, states, and outputs, typically for display on the GUI.

Graphical model representation can involve automatic code generation, a process whereby software source code and/or hardware design language (HDL) source code is automatically produced from a graphical model representation of a dynamic system. For example, the software source code produced by the automatic code generation process can be compiled and executed on a target processor, implementing the functionality specified by the graphical model representation. A code generation report can also be produced. A code generation report is a mark up language document that contains information of the source graphical model representation, settings of the code generator and the generated software (code) in syntax highlighted form. Each part of the generated software is translated by a compiler and saved into its own mark up language file. These markup language reports can be extremely long, complex and detailed.

SUMMARY

According to one aspect of the invention, a method includes performing an analysis or synthesis operation on a graphical model representation, producing a report from the analysis or synthesis operation, and generating associations representing elements of the graphical model representation with corresponding elements in the report.

One or more of the following features can also be included. The report can be a document structured with portions corresponding to different elements of the graphical model representation. The document can be a structural coverage report. The document can be a code generation report incorporating syntax highlighted code. The document can be a profiling report that documents relative execution times of each of the elements.

In embodiments, the method can include loading an element in the report in response to activating a graphical object on the graphical model representation. Activating can be a computer mouse action. The associations are markup language tags. The markup language tags are hypertext markup language (HTML) tags. The report can be a model coverage report. The report can be a generated code report.

According to another aspect of the invention, a system includes a means for performing an analysis or synthesis operation on a graphical model representation, a means for producing a report from the analysis or synthesis operation, and a means for generating associations representing elements of the graphical model representation with corresponding elements in the report.

One or more of the following features can also be included. The system can include a means for loading an element in the report in response to activating one of the graphical model elements. The report can be a document structured with portions corresponding to different elements of the graphical model representation. The document can be a structural coverage report. The document can be a code generation report incorporating syntax highlighted code. The document can be a profiling report that documents relative execution times of each of the elements. The associations can be markup language tags. The markup language tags can be hypertext markup language (HTML) tags. The markup language tags can be portable document format (PDF) embedded links. The report can be a model coverage report. The report can be a generated code report.

Other features, objects, and advantages of the invention will be apparent from the description and drawings, and from the claims.

DESCRIPTION OF DRAWINGS

FIG. 4 is an exemplary graphical model representation of a dynamic system.

DETAILED DESCRIPTION

Figure 1:
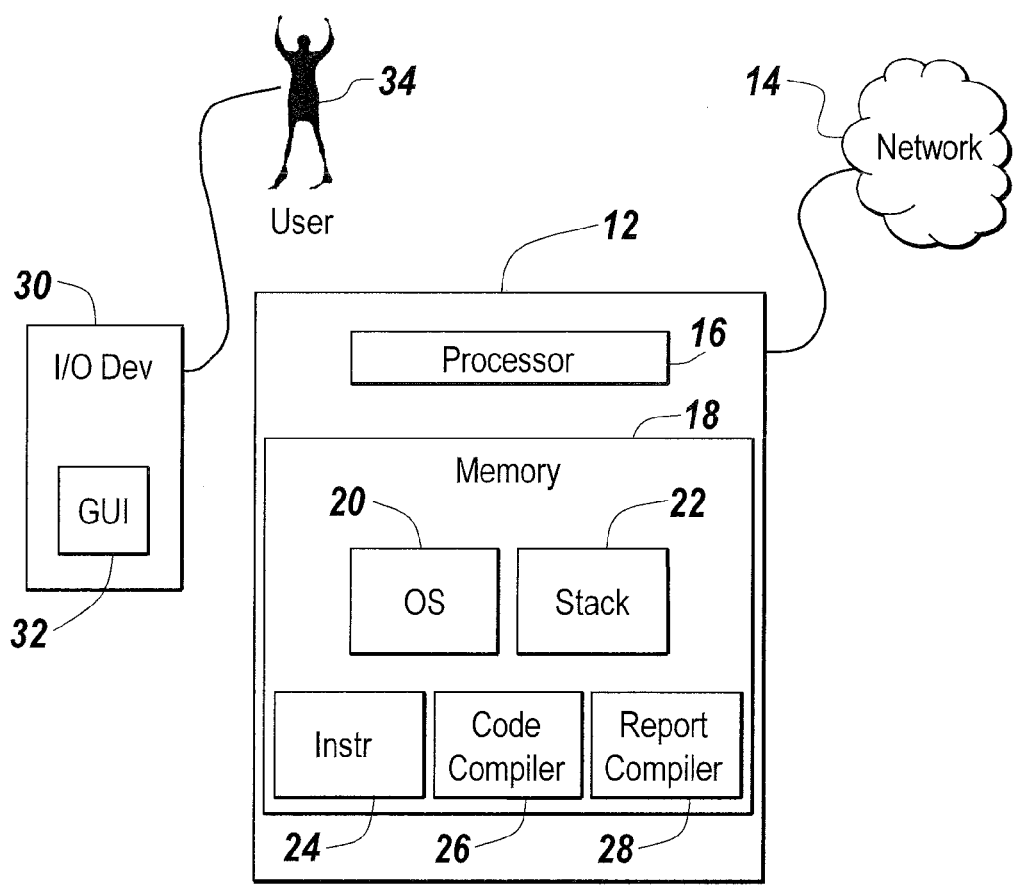
FIG. 1 is a graphical model representation of a code generation report generating system.

In FIG. 1, an exemplary code generation report generating system 10 includes a computer 12, such as a personal computer (PC). Computer 12 is connected to a network 14, such as the Internet, that runs TCP/IP (Transmission Control Protocol/Internet Protocol) or other suitable protocol. Connections can be via Internet, wireless link, telephone line, and the like.

Computer 12 includes a processor 16 and memory 18. Memory 18 stores an operating system (OS) 20 such as Windows XP or Linux, a TCP/IP protocol stack 22 for communicating over network 14, machine executable instructions 24 executed by processor 16 to perform a reverse link graphical diagram representation process 100, and a report compiler 28. Computer 12 includes an input/output (I/O) device 30 for display of a graphical user interface (GUI) 32 to a user 34. A graphical model representation can be displayed on the GUI 32 using, for example, a model editor (not shown). The GUI 32 is also used as a document viewer, which displays textual content, e.g., a report.

Figure 2:
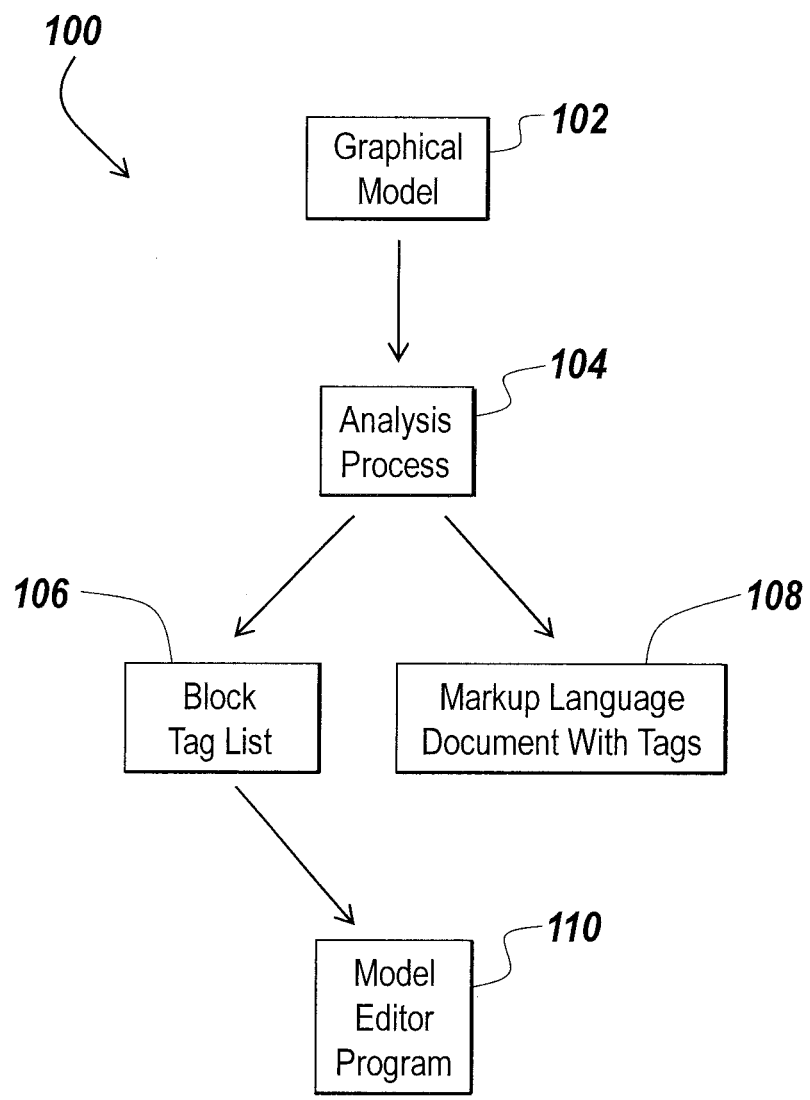
FIG. 2 is a flow diagram of the reverse linked code from graphical diagram representation process of FIG. 1.

In FIG. 2 the reverse link graphical diagram representation process 100 includes generating (102) a graphical model representation. The graphical model representation represents a dynamic system to be simulated and is displayed to the user 34 on the GUI 32 (e.g., through model editor) of the input/output device 30.

The graphical model representation is specified by the user 34 and represented by a model diagram source model language such as, for example, Simulink® from The Mathworks, Inc. of Natick, Mass. The graphical model is subject to an analysis process 104. The analysis process 104 generates (104) a report from the graphical model representation. The report may take the form of a mark-up language document (such as HTML document) that includes tags. The analysis process generates a block tag list (106) that contains tags for the blocks in the graphical model. The block tag 106 list associates blocks with tags. The block tag list 106 is sent to a model editor program 110, which is responsible for displaying the graphical model 102.

Each graphical object in the graphical model representation that is translated into code is referenced within the code with a tag and the same tag associated with a section of the report. Thus, the user 34 can select a graphical object on the graphical model representation and immediately the viewer displays a location in the report corresponding to that graphical object on the graphical model representation. The graphical model representation contains links or tags to the report that allow the user 34 to navigate from the graphical model representation to the report.

The same tags that are embedded in the report are stored as part of the data structures represented by the graphical objects in the graphical model representation. A tag or association, which can be a hyperlink, is a selectable connection from one word, picture, or information object to another in a multimedia environment such as the World Wide Web, and such objects can include sound and motion video sequences. The most common form of link is a highlighted word or picture that can be selected by the user (with a mouse or in some other fashion), resulting in the immediate delivery and view of another file. The highlighted object is referred to as an anchor. The anchor reference and the object referred to constitute a hyperlink.

Using the graphical model representation as a navigation aid to a report is an elegant way to index into a long and complex report. The report can be any form of document that is structured with portions corresponding to different graphical objects. Examples of reports include: structural coverage reports, code generation reports that incorporate syntax highlighted code, and profiling reports that document the relevant execution times of each model element. The graphical representation can be any hierarchical or non-hierarchical combination of graphical model representations, control flow diagrams, state diagrams and/or data flow diagrams provided within an editor or a viewer that is capable of responding to mouse actions.

A mouse action can be either the result of a movement of a graphical object, a mouse click on top of a graphical object, or the selection of a menu item from a pop-up menu for a graphical object. The result of the mouse action is that a document tag is retrieved from the editor and is passed to the document viewer causing the visible portion of the document to be adjusted to a specified point.

Using a graphical model representation as a navigation tool for a report is an alternative to browsing a structural index of the report or performing some type of text search on the report itself. Both of these techniques are tedious by comparison, thus process 100 allows the user 34 to scan through a familiar graphical representation of a design, i.e., the graphical model representation, and quickly access desired information.

Figure 3:
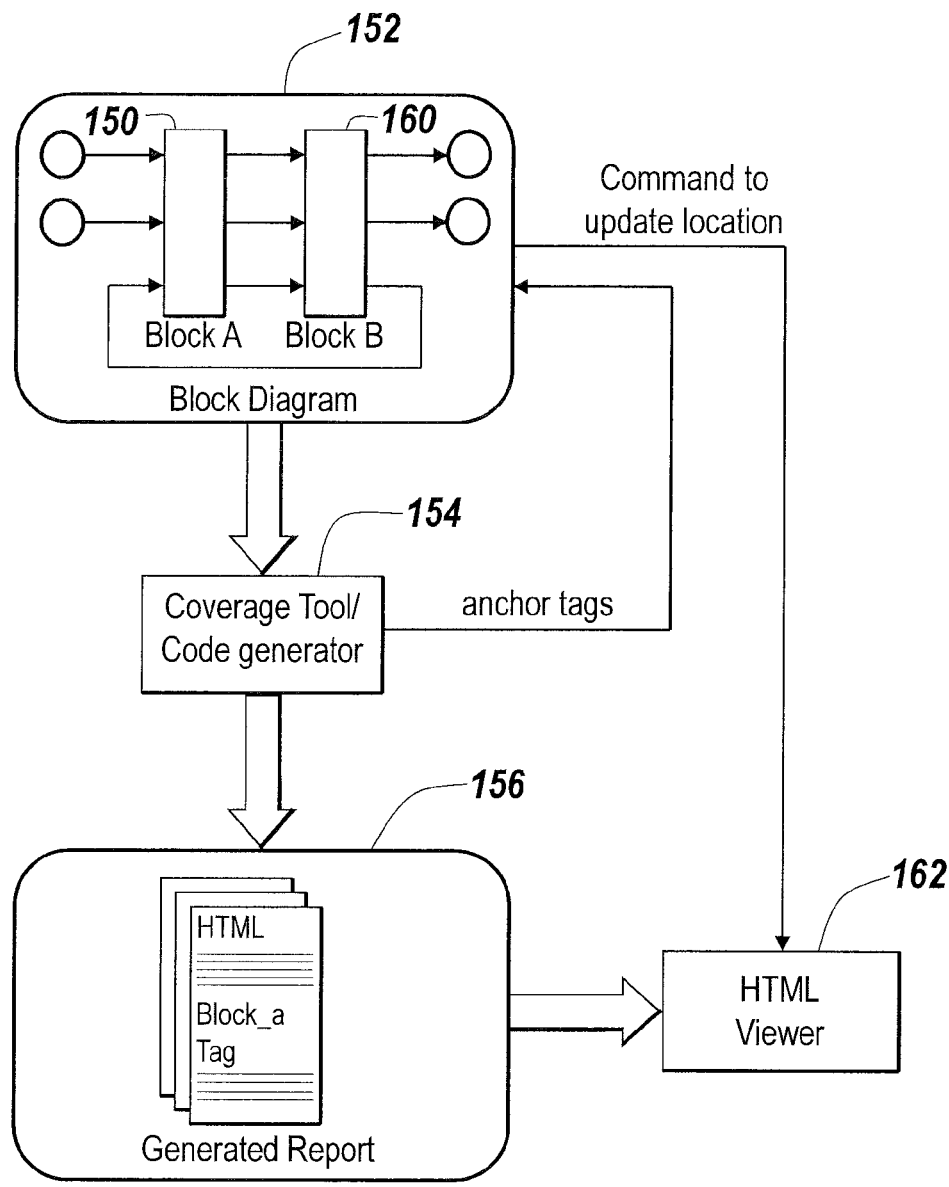
FIG. 3 is a block diagram showing an interaction of a report generator, graphical modeling tool and viewer.

In FIG. 3, a relationship diagram 150 includes a graphical model representation 152, an analysis program and report generator 154 and a generated report 156. The graphical model representation 152 includes blocks 158, 160 and is represented by a model language (not shown). During report generation 154 tags are sent to both appropriate sections of the graphical model representation 152 and the report 156. The same tags are stored as part of the graphical model representation language data structures for block 158, 160. An editor 162 can respond to mouse actions on the tags associated with the blocks 158, 160, and serve a command to position the viewer 162 to the corresponding elements in the report 156. The tags provide communication (e.g., mapping) between elements of the graphical model representation 152 and the report 156. An example of logic within the HTML viewer 162 that responds to mouse clicks is:

function on_mouse_click (blockData)
        if not is empty (blockData.html Tag)
        browser.setlocation (blockData.htmlTag)
    end In FIG. 4, an exemplary graphical model representation 190 and associated code generation report 192 are shown. The model elements 201' to 210' include tags that point to corresponding lines 201 to 210 in the code generation report 192. For example, a tag located at 201' points to a gain block representation 201 in the code generation report 192.

In other examples, process 100 is used in conjunction with a model coverage report. Model coverage is a measure of how thoroughly a test of a model tests the model. A model coverage tool determines the extent to which a model test exercises simulation control flow paths through a model. The percentage of paths that a test case exercises is called its model coverage.

For Mathworks Stateflow® charts, the model coverage tool records the execution of the chart itself and the execution of its states, transition decisions, and the individual conditions that compose each decision. When simulation is finished, a model coverage report tells the user how thoroughly a model has been tested in terms of how many times each exclusive OR substrate has been active and inactive, how many times each transition decision has been evaluated True or False, and how many times each condition (predicate) has been evaluated True or False.

The invention can be implemented in digital electronic circuitry, or in computer hardware, firmware, software, or in combinations of them. The invention can be implemented as a computer program product, i.e., a computer program tangibly embodied in an information carrier, e.g., in a machine-readable storage device or in a propagated signal, for execution by, or to control the operation of, data processing apparatus, e.g., a programmable processor, a computer, or multiple computers. A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Method steps of the invention can be performed by one or more programmable processors executing a computer program to perform functions of the invention by operating on input data and generating output. Method steps can also be performed by, and apparatus of the invention can be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in special purpose logic circuitry.

The invention has been described in terms of particular embodiments. Other embodiments are within the scope of the following claims.

What is claimed is:

1. A computer-implemented method comprising:
    interacting, using the computer, with an executable graphical model representation that includes executable graphical objects representing a dynamic system for simulation, where executing the executable graphical objects simulates the dynamic system represented by the executable graphical objects;
    producing a report associated with the executable graphical model representation, the report including textual content, the producing including:
        generating one or more tags for one or more of the executable graphical objects;
        associating the one or more tags with the one or more of the executable graphical objects;
        associating the one or more tags, which are associated with one of the executable graphical objects, with a portion of the produced report, the portion corresponding to the one of the executable graphical objects;
        creating a selectable connection from the one of the executable graphical objects to the portion of the produced report, where:
            the produced report is provided in a programming environment capable of processing textual data, and
            the executable graphical model representation serves as a navigation tool to interact with the report;
    receiving a user input, the user input selecting the one of the executable graphical objects in the executable graphical model representation;
    generating a command,
        the command to position a viewer to the portion of the produced report corresponding to the one of the executable graphical objects,
        the positioning based on the selecting the one of the executable graphical objects in the executable graphical model representation; and
    displaying, using the viewer and based on the user input, the portion of the produced report corresponding to the one of the executable graphical objects selected in the executable graphical model representation.

2. The method of claim 1 further comprising:
    performing an analysis or synthesis operation in connection with the executable graphical model representation, and
    generating the report based on the analysis or synthesis operation.

3. The method of claim 1, wherein portions of the report correspond to elements of the graphical model representation.

4. The method of claim 1, wherein the report is a structural coverage report.

5. The method of claim 1, wherein the report is a code generation report incorporating syntax highlighted code.

6. The method of claim 1, wherein the report is a profiling report, the profiling report documenting relative execution times of each of the executable graphical objects.

7. The method of claim 1, wherein the one or more tags are markup language tags.

8. The method of claim 7, wherein the markup language tags are hypertext markup language (HTML) tags.

9. The method of claim 1, wherein the report is a model coverage report.

10. A system comprising:
    a processor for executing instructions to:
        interact with an executable graphical model representation that includes executable graphical objects representing a dynamic system for simulation, where executing the executable graphical objects simulates the dynamic system represented by the executable graphical objects;
        produce a report associated with the executable graphical model representation, the report including textual content, the producing including:
            generating one or more tags for one or more of the executable graphical objects;
            associating the one or more tags with the one or more executable graphical objects;
            associating tags associated with one of the executable graphical objects with a portion of the produced report, the portion corresponding to the one of the executable graphical objects;
            creating a selectable connection from the one of the executable graphical objects to the portion of the produced report, where:
                the produced report is provided in a programming environment capable of processing textual data, and
                the executable graphical model representation serves as a navigation tool to interact with the report;
        receive a user input, the user input selecting the one of the executable graphical objects in the executable graphical model representation;
        generate a command,
            the command to position a viewer to the portion of the produced report corresponding to the one of the executable graphical objects,
            the positioning based on the selecting the one of the executable graphical objects in the executable graphical model representation; and
    a display device for:
        displaying, using the viewer and based on the user selection, the portion of the produced report corresponding to the one of the executable graphical objects selected in the executable graphical model representation.

11. A non-transitory machine-readable medium storing instructions that, when executed by a processor, cause the processor to:
    interact with an executable graphical model representation that includes executable graphical objects representing a dynamic system for simulation, where executing the executable graphical objects simulates the dynamic system represented by the executable graphical objects;
    produce a report associated with the executable graphical model representation, the report including textual content, the producing including:
        generating one or more tags for one or more of the executable graphical objects;
        associating the one or more tags with the one or more executable graphical objects;
        associating tags associated with one of the executable graphical objects with a portion of the produced report, the portion corresponding to the one of the executable graphical objects;
        creating a selectable connection from the one of the executable graphical objects to the portion of the produced report, where:
            the produced report is provided in a programming environment capable of processing textual data, and
            the executable graphical model representation serves as a navigation tool to interact with the report;
    receive a user input selecting the one of the executable graphical objects in the executable graphical model representation;
    generate a command,
        the command to position a viewer to the portion of the produced report corresponding to the one of the executable graphical objects,
        the positioning based on the selecting the one of the executable graphical objects in the executable graphical model representation; and
    display, using the viewer and based on the user input, the portion of the produced report corresponding to the one of the executable graphical objects selected in the executable graphical model representation.

12. The medium of claim 11 further storing instructions that, when executed on the processor, cause the processor to:
    perform an analysis or synthesis operation in connection with the executable graphical model representation, and
    generate the report based on the analysis or synthesis operation.

13. The medium of claim 11, wherein portions of the report correspond to elements of the graphical model representation.

14. The medium of claim 11, wherein the report is a structural coverage report.

15. The medium of claim 11, wherein the report is a code generation report incorporating syntax highlighted code.

16. The medium of claim 11, wherein the report is a profiling report, the profiling report documenting relative execution times of each of the executable graphical objects.

17. The medium of claim 11, wherein the one or more tags are markup language tags.

18. The medium of claim 17, wherein the markup language tags are hypertext markup language (HTML) tags.

19. The medium of claim 11, wherein the report is a model coverage report.

\* \* \* \* \*

UNITED STATES PATENT AND TRADEMARK OFFICE
CERTIFICATE OF CORRECTION

| | | |
|---|---|---|
| PATENT NO. | : 9,110,570 B1 | Page 1 of 1 |
| APPLICATION NO. | : 13/268958 | |
| DATED | : August 18, 2015 | |
| INVENTOR(S) | : William J. Aldrich | |

It is certified that error appears in the above-identified patent and that said Letters Patent is hereby corrected as shown below:

Title Page

Item (56) under "Other Publications", delete "et. al." and insert --et al.-- therefor.

Page 2, column 2, line 1 under "Other Publications", delete "et. al." and insert --et al.-- therefor.

Signed and Sealed this
Twenty-ninth Day of March, 2016

Michelle K. Lee
*Director of the United States Patent and Trademark Office*